United States Patent
Wang et al.

(10) Patent No.: US 10,157,995 B2
(45) Date of Patent: Dec. 18, 2018

(54) INTEGRATING JUNCTION FORMATION OF TRANSISTORS WITH CONTACT FORMATION

(71) Applicant: Taiwan Semiconductor Manufacturing Company, Ltd., Hsin-Chu (TW)

(72) Inventors: Li-Ting Wang, Tainan (TW); Teng-Chun Tsai, Hsin-Chu (TW); Chun-Hsiung Lin, Zhubei (TW); Cheng-Tung Lin, Jhudong Township (TW); Chi-Yuan Chen, Taichung (TW); Hong-Mao Lee, Hsin-Chu (TW); Huicheng Chang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/963,911

(22) Filed: Aug. 9, 2013

(65) Prior Publication Data

US 2015/0044842 A1 Feb. 12, 2015

(51) Int. Cl.
| | |
|---|---|
| *H01L 29/66* | (2006.01) |
| *H01L 21/762* | (2006.01) |
| *H01L 21/225* | (2006.01) |
| *H01L 21/285* | (2006.01) |
| *H01L 29/10* | (2006.01) |

(52) U.S. Cl.
CPC ........ *H01L 29/665* (2013.01); *H01L 21/2254* (2013.01); *H01L 21/28518* (2013.01); *H01L 21/76224* (2013.01); *H01L 29/1054* (2013.01); *H01L 29/6659* (2013.01); *H01L 29/66545* (2013.01); *H01L 29/66651* (2013.01); *H01L 29/66803* (2013.01)

(58) Field of Classification Search
CPC ... H01L 21/0455; H01L 21/182; H01L 21/38; H01L 21/2258
See application file for complete search history.

(56) References Cited

U.S. PATENT DOCUMENTS

| | | | | |
|---|---|---|---|---|
| 3,907,616 | A | * | 9/1975 | Wiemer .................. 438/535 |
| 4,359,490 | A | * | 11/1982 | Lehrer .................... 438/680 |
| 4,647,361 | A | * | 3/1987 | Bauer ................... 204/298.09 |

(Continued)

OTHER PUBLICATIONS

Prof. S. Gleixner, San Jose State University, Course MatE 270, lecture notes, W10_CVDprocesses.pdf, http://www.engr.sjsu.edu/sgleixner/mate270/LectureNotes/W10_CVDprocesses.pdf, Jul. 9, 2012.*

(Continued)

*Primary Examiner* — Yu Chen
*Assistant Examiner* — Vincent Wall
(74) *Attorney, Agent, or Firm* — Slater Matsil, LLP

(57) ABSTRACT

A method includes forming a gate stack over a semiconductor region, depositing an impurity layer over the semiconductor region, and depositing a metal layer over the impurity layer. An annealing is then performed, wherein the elements in the impurity layer are diffused into a portion of the semiconductor region by the annealing to form a source/drain region, and wherein the metal layer reacts with a surface layer of the portion of the semiconductor region to form a source/drain silicide region over the source/drain region.

20 Claims, 11 Drawing Sheets

(56) References Cited

U.S. PATENT DOCUMENTS

| | | | | |
|---|---|---|---|---|
| 5,025,751 | A | * | 6/1991 | Takatani et al. ............... 118/733 |
| 5,047,367 | A | * | 9/1991 | Wei et al. ..................... 438/607 |
| 5,081,518 | A | * | 1/1992 | El-Diwany ....... H01L 23/53271 257/336 |
| 5,217,924 | A | * | 6/1993 | Rodder et al. ................. 438/301 |
| 5,529,958 | A | * | 6/1996 | Yaoita .......................... 438/655 |
| 5,780,350 | A | * | 7/1998 | Kapoor .............. H01L 29/7833 257/E29.266 |
| 6,096,599 | A | * | 8/2000 | Kepler et al. .................. 438/249 |
| 6,153,455 | A | * | 11/2000 | Ling ............... H01L 21/823864 257/369 |
| 6,165,826 | A | * | 12/2000 | Chau et al. .................... 438/231 |
| 6,268,068 | B1 | * | 7/2001 | Heuer ..................... C23C 16/24 257/E21.101 |
| 6,294,797 | B1 | * | 9/2001 | Wu .................... H01L 21/28247 257/377 |
| 6,426,291 | B1 | | 7/2002 | Hu et al. |
| 6,451,701 | B1 | * | 9/2002 | Wang et al. .................. 438/705 |
| 7,611,938 | B2 | * | 11/2009 | Cheng et al. ................. 438/199 |
| 2002/0102805 | A1 | * | 8/2002 | Cheng ................ H01L 21/2254 438/369 |
| 2006/0014366 | A1 | * | 1/2006 | Currie .......................... 438/517 |
| 2006/0208300 | A1 | * | 9/2006 | Iwanaga ......... H01L 21/823431 257/308 |
| 2008/0185650 | A1 | * | 8/2008 | Chen ................ H01L 29/66795 257/348 |
| 2008/0265321 | A1 | * | 10/2008 | Yu ..................... H01L 21/26586 257/344 |
| 2011/0049629 | A1 | * | 3/2011 | Ishikawa ........... H01L 21/76243 257/350 |
| 2011/0223736 | A1 | * | 9/2011 | Lin ................. H01L 21/823821 438/305 |
| 2013/0001659 | A1 | * | 1/2013 | Cheng et al. ................. 257/288 |
| 2013/0011983 | A1 | * | 1/2013 | Tsai et al. ..................... 438/285 |
| 2014/0065819 | A1 | * | 3/2014 | Ahmed et al. ................ 438/664 |
| 2014/0070358 | A1 | * | 3/2014 | Qi et al. ........................ 257/499 |

OTHER PUBLICATIONS

Cheung, N., "Lecture 18: IC Process Integration", http://www-inst.eecs.berkeley.edu/~ee143/fa10/lectures/Lec_18.pdf, Fall 2010, pp. 1-37.*

Kong, Eugene et al., "Novel Technique Comprising Silane Treatment and Laser Anneal for Abrupt Ultra-Shallow Junction Formation for InGaAs n-MOSFETs," VLSI Technology, Systems, and Applications (VLSI-TSA), Apr. 22-24, 2013, 2 pages.

Loh, W.-Y et al., "Sub-10nm junction in InGaAs with sulfur mon-layer doping," VLSI Technology, Systems, and Applications (VLSI-TSA), Apr. 22-24, 2013, 2 pages.

* cited by examiner

INTEGRATING JUNCTION FORMATION OF TRANSISTORS WITH CONTACT FORMATION

BACKGROUND

The formation of transistors involves many process steps, including forming gate dielectrics and gate electrodes, forming source and drain regions, and forming silicide regions for the source/drain regions and possibly for gate electrodes. The formation of each of the above-listed components may also involve several process steps. In addition, various cleaning processes are performed to remove undesirable substances such as the oxide of the formed features. These process steps cause the increase in the manufacturing cost of the integrated circuits. In addition, the formation of transistors may include a plurality of thermal processes, and the resulting thermal budget is high. For example, after the formation of the source and drain regions, a thermal activation is performed to activate the impurities in the source and drain regions. The formation of the silicide regions also requires some thermal budget.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A transistor and the method of forming the same are provided in accordance with various exemplary embodiments. The intermediate stages of forming the transistor are illustrated. The variations of the embodiments are discussed. Throughout the various views and illustrative embodiments, like reference numbers are used to designate like elements.

Figure 1:
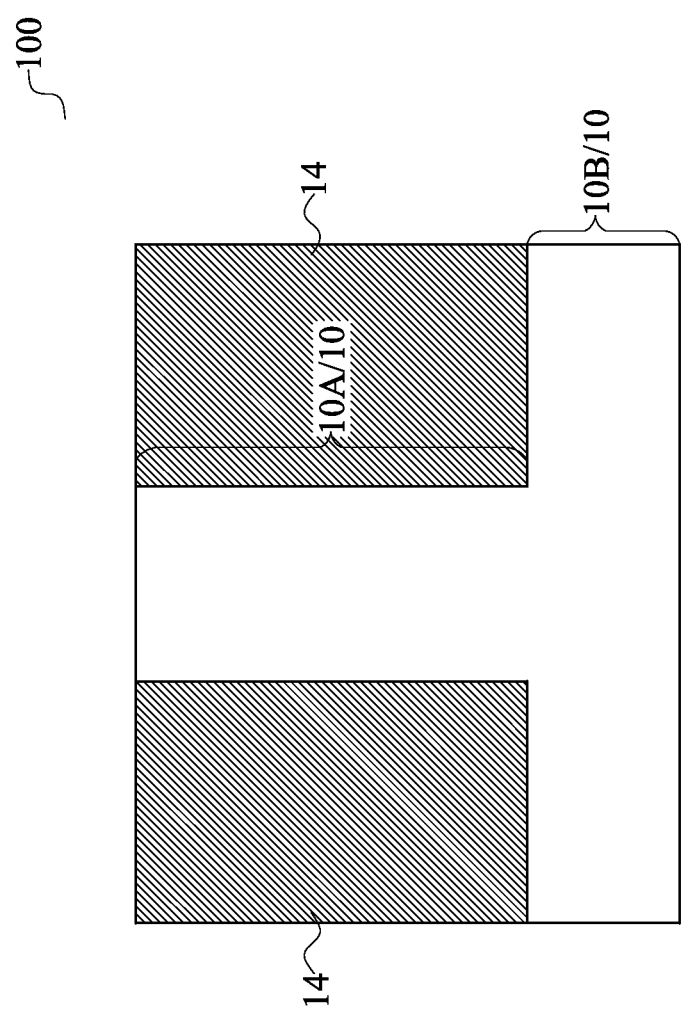
FIGS. 1 through 9 are cross-sectional views of intermediate stages in the manufacturing of a transistor in accordance with some exemplary embodiments.

FIGS. 1 through 9 illustrate the cross-sectional views of intermediate stages in the formation of a semiconductor fin and a Fin Field-Effect Transistor (FinFET) in accordance with exemplary embodiments. Referring to FIG. 1, substrate 10, which is a part of semiconductor wafer 100, is provided. Substrate 10 may be a single-crystalline silicon substrate. Alternatively, substrate 10 is formed of other materials such as silicon carbon. Isolation regions such as Shallow Trench Isolation (STI) regions 14 are formed in substrate 10. Substrate 10 thus includes region 10A between STI regions 14, and region 10B under STI regions 14. The formation process of STI regions 14 may include etching substrate 10 to form recesses (occupied by STI regions 14), filling the recesses with a dielectric material(s), and performing a planarization to remove excess dielectric materials. The remaining portions of the dielectric material(s) form STI regions 14. In some embodiments, STI regions 14 comprise silicon oxide.

Figure 2:
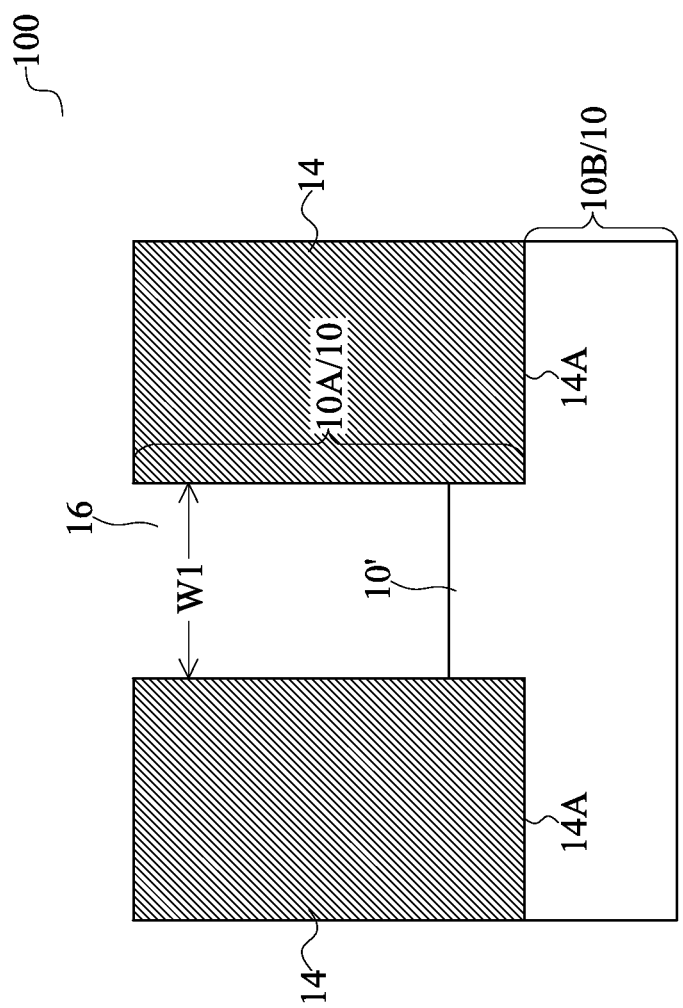

Next, as shown in FIG. 2, region 10A of substrate 10, which region 10A is between opposite sidewalls of STI regions 14, is etched to form trench 16. In some embodiments, top surface 10' of substrate 10, which top surface 10' is exposed to trench 16, is substantially level with bottom surfaces 14A of STI regions 14. In alternative embodiments, top surface 10' of substrate portion 10A is higher than or lower than bottom surfaces 14A of STI regions 14. The etching may be performed using dry etch, with the etching gas selected from $CF_4$, $Cl_2$, $NF_3$, $SF_6$, and combinations thereof. In alternative embodiments, the etching may be performed using wet etching, for example, using Tetra-Methyl Ammonium Hydroxide (TMAH), a potassium hydroxide (KOH) solution, or the like, as an etchant. In the resulting structure, trench 16 may have width W1 smaller than about 150 nm. Width W1 may also be between about 10 nm and about 100 nm. It is appreciated, however, that the values recited throughout the description are merely examples, and may be changed to different values.

Figure 3:
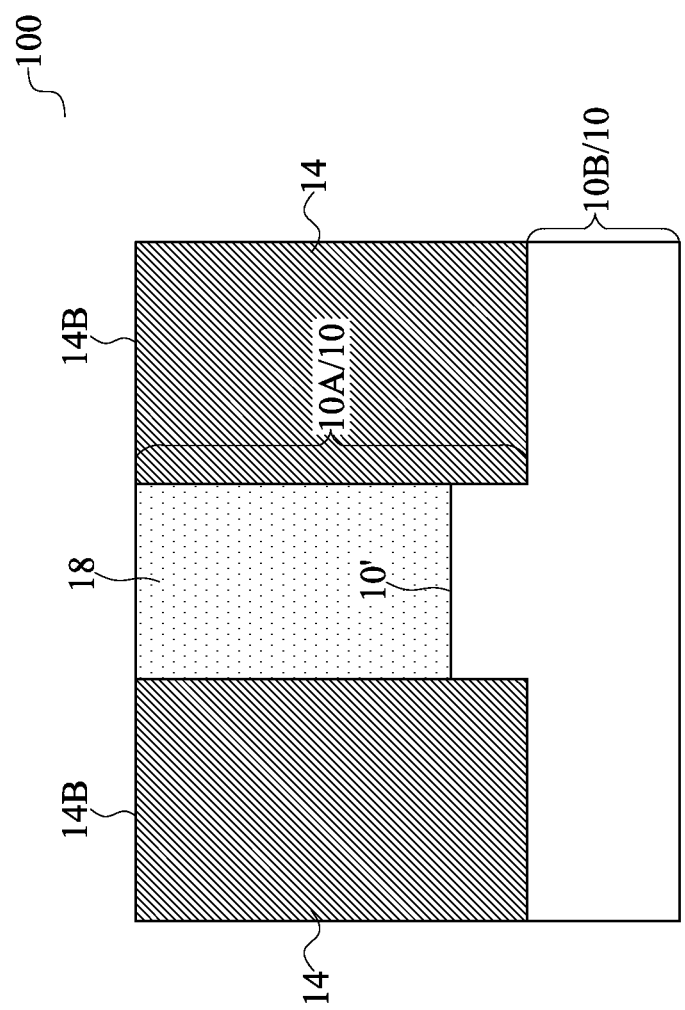

FIG. 3 illustrates the epitaxy for growing semiconductor region 18 from the exposed top surface 10'. In some embodiments, semiconductor region 18 comprises a III-V compound semiconductor material, which may be a binary or a ternary III-V compound semiconductor material. The exemplary III-V compound semiconductor material for forming semiconductor region 18 may be selected from InAs, AlAs, GaAs, InP, GaN, InGaAs, InAlAs, GaSb, AlSb, AlP, GaP, and combinations thereof. Semiconductor region 18 may be a homogenous region, with the entirety of semiconductor region 18 formed of a same material, which may be selected from the above-listed III-V compound semiconductor materials. Semiconductor region 18 may also be a composite region, with a plurality of stacked layers comprising different materials and/or having different compositions. For example, the upper portions of semiconductor region 18 may have greater lattice mismatch with substrate 10 than the lower portions. In alternative embodiments, semiconductor region 18 comprises silicon germanium, which may have a germanium percentage between about 15 percent and about 60 percent, for example. The germanium percentage may also be higher. In some embodiments, semiconductor region 18 is a substantially pure germanium region with, for example, a germanium percentage higher than about 95 percent. In alternative embodiments, semiconductor region 18 comprises silicon phosphorous.

The epitaxy may be continued until the top surface of semiconductor region 18 is higher than top surfaces 14B of STI regions 14. A planarization is then performed. The planarization may include a Chemical Mechanical Polish (CMP). The planarization is continued until no semiconductor region 18 is left overlapping STI regions 14. The portion of semiconductor region 18 between STI regions 14, however, remains after the planarization, and is referred to as semiconductor strip 18 hereinafter. In alternative embodiments, the epitaxy is stopped when the top surface of semiconductor region 18 is level with, or lower than, top surfaces 14B of STI regions 14. In these embodiments, the planarization step may be skipped, or may be performed.

Figure 4:
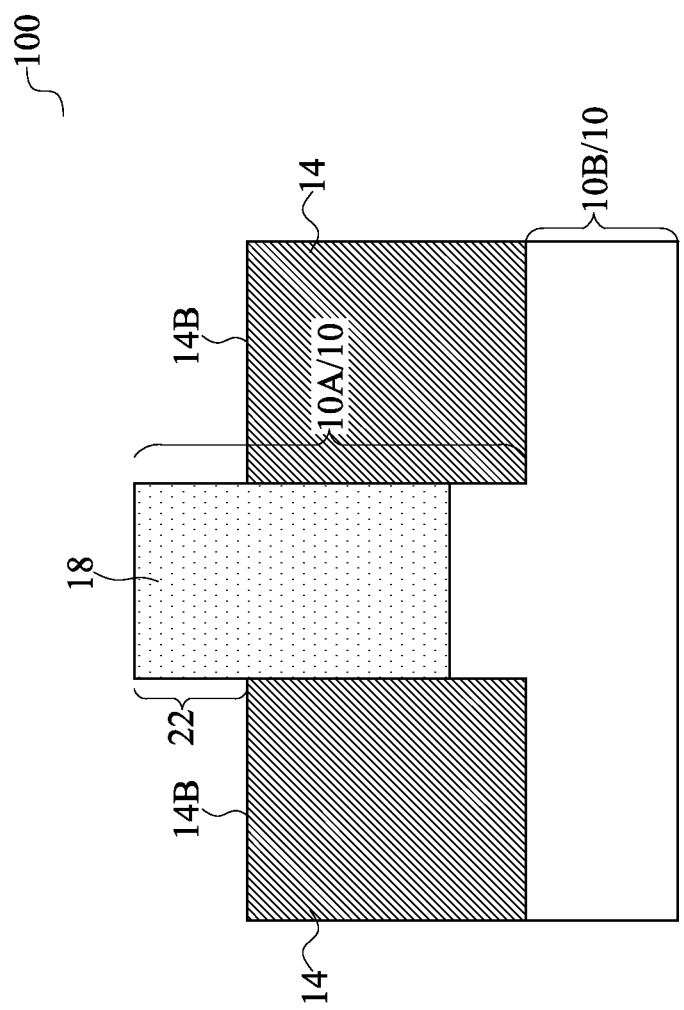

Referring to FIG. 4, STI regions 14 are recessed, for example, through an etching step. A portion of semiconductor strip 18 is thus higher than top surfaces 14B of STI regions 14. This portion of semiconductor strip 18 forms semiconductor fin 22, which may be used to form a FinFET.

Figure 5A:
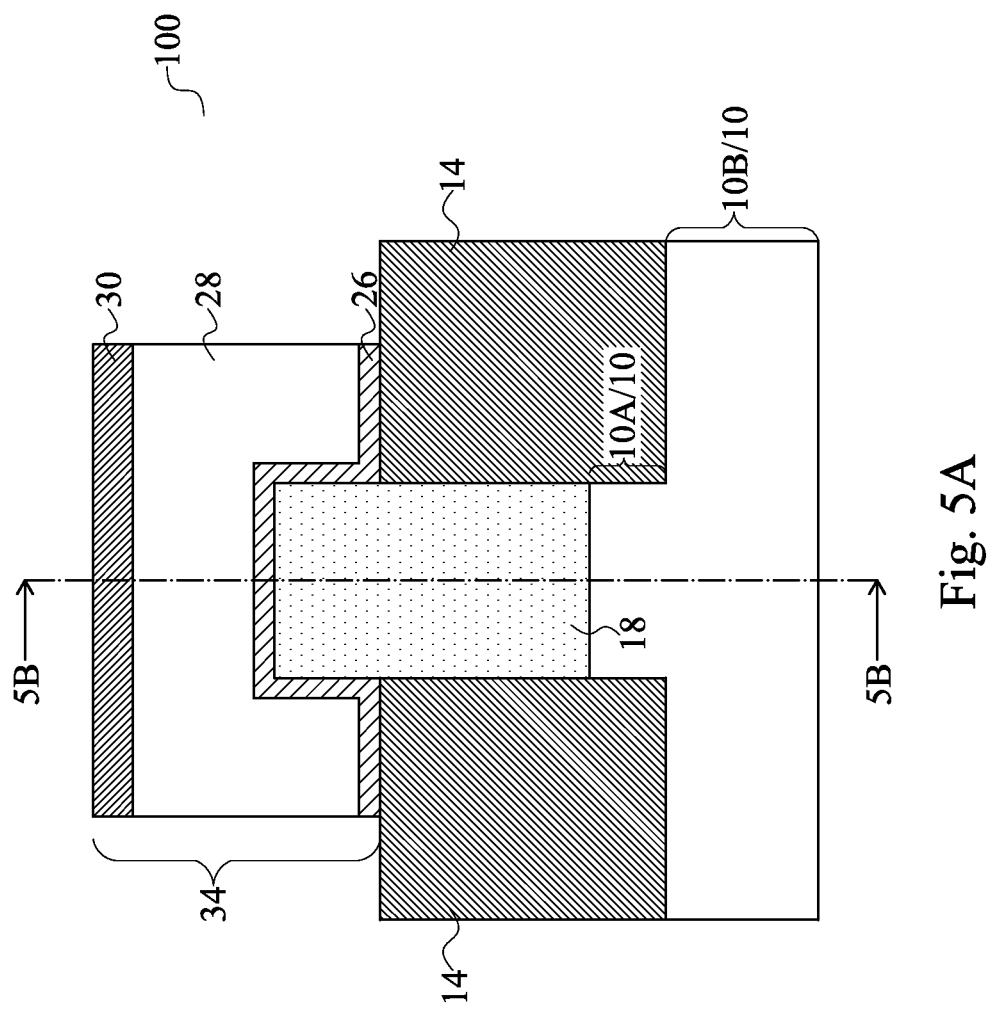

Referring to FIG. 5A, gate stack 34, which includes gate dielectric 26, gate electrode 28, and hard mask 30, is formed. Gate dielectric 26 may be formed of a dielectric material such as silicon oxide, silicon nitride, an oxynitride, multi-layers thereof, and combinations thereof. Gate dielectric 26 may also comprise high-k dielectric materials. The exemplary high-k materials may have k values greater than about 4.0, or greater than about 7.0. Gate electrode 28 may be formed of polysilicon, metals, metal nitrides, metal silicides, and/or the like. The bottom ends of gate dielectric 26 may contact the top surface of STI regions 14.

Figure 5B:
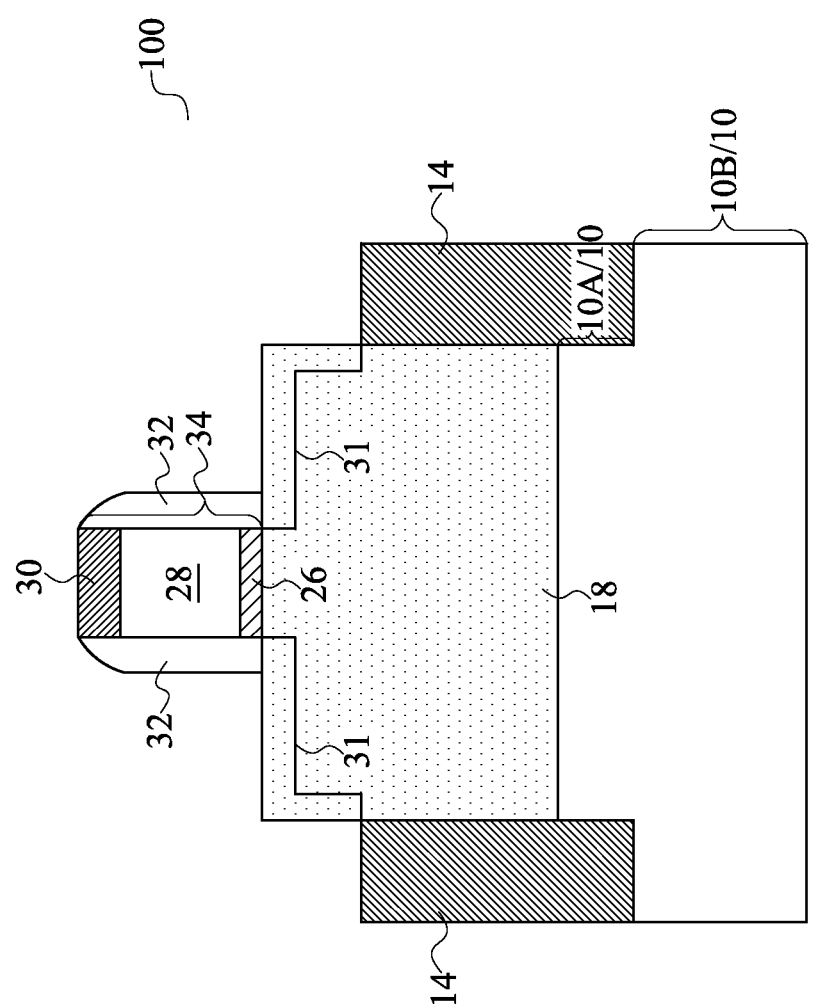

FIG. 5B illustrates a cross-sectional view of the structure in FIG. 5A, wherein the cross-sectional view is obtained from the vertical plane containing line 5B-5B in FIG. 5A. As shown in FIG. 5B, gate stack 34 covers a center portion of semiconductor fin 22, and the opposite end portions of semiconductor fin 22 are exposed. Lightly Doped Drain/source (LDD) regions 31 are formed in semiconductor fin 22, for example, through an implantation. Gate spacers 32 are then formed on the sidewalls of gate stack 34. The conductivity type of LDD regions 31 is the same as the conductivity type of the resulting FinFET.

Figure 6:
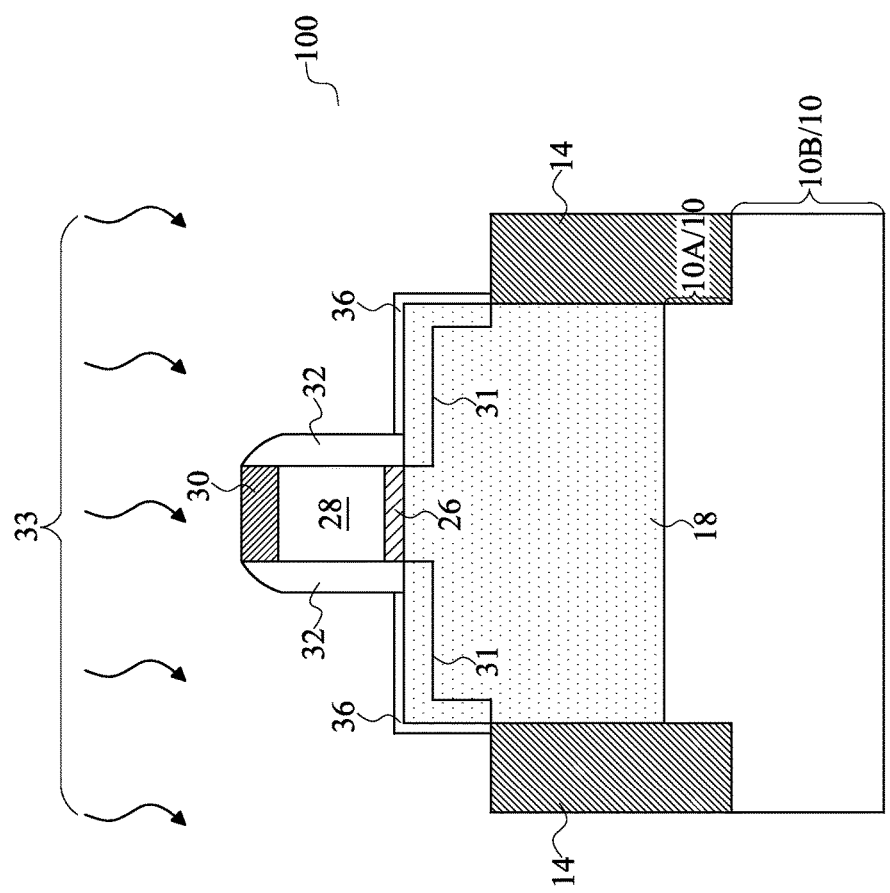

In some embodiments, as shown in FIG. 6, a pre-clean step (represented by arrows 33) is performed to clean the surface of semiconductor fin 22. For example, native oxide 36 may occur on the surface of semiconductor fin 22, wherein native oxide 36 may be formed due to the exposure of semiconductor fin 22 to open air. In accordance with some embodiments, native oxide 36 is removed through the sputtering using, for example, argon, as a sputter gas. In alternative embodiments, native oxide 36 is removed through etching using a combined gas of hydrogen ($H_2$) and hydrogen fluoride (HCl) as an etchant gas. In yet alternative embodiments, native oxide 36 is removed through etching using chlorine ($Cl_2$) as an etchant gas. In some embodiments, during the pre-clean, a high-temperature baking is performed on wafer 100 with the presence of the etchant gas. The baking temperature may be between about 700° C. and about 900° C. The pressure of the etchant gas may be between about 10 Torr and about 200 Torr, for example. The pre-clean may last for a period of time between about 30 seconds and about 4 minutes, for example. As a result of the pre-clean, native oxide 36 is removed.

Figure 10:
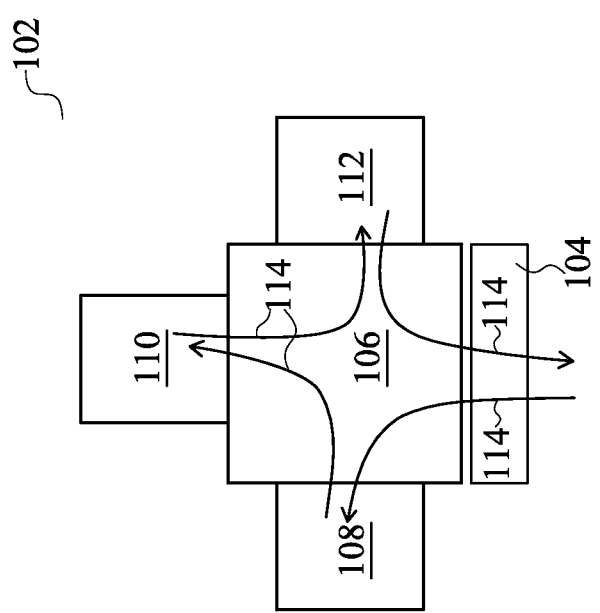
FIG. 10 illustrates a production tool in accordance with some embodiments, wherein the production tool is used for forming a transistor in accordance with the embodiments.

FIG. 10 illustrates a schematic view of production tool 102, which includes loading and unloading station 104 for loading and unloading wafer 100 as shown in FIG. 6. Production tool 102 also includes chambers 108, 110, and 112 for performing subsequent process steps. Chamber 106 is used for transferring wafer 100 (FIG. 6) between chambers 108, 110, and 112. Production tool 102 is configured, so that during the processing of wafer 100 in each of chambers 108, 110, and 112, and during the transferring of wafer 100 between chambers 106, 108, 110, and 112, vacuum is maintained inside production tool 102, and wafer 100 is not exposed to open air, until wafer 100 is transferred out of production tool 102 through loading/unloading station 104. An exemplary transferring sequence of wafer 100 is illustrated using arrows 114. In accordance with some embodiments, the pre-clean is performed in chamber 108. After the pre-clean, wafer 100 is transferred to chamber 110 through chamber 106.

Figure 7:
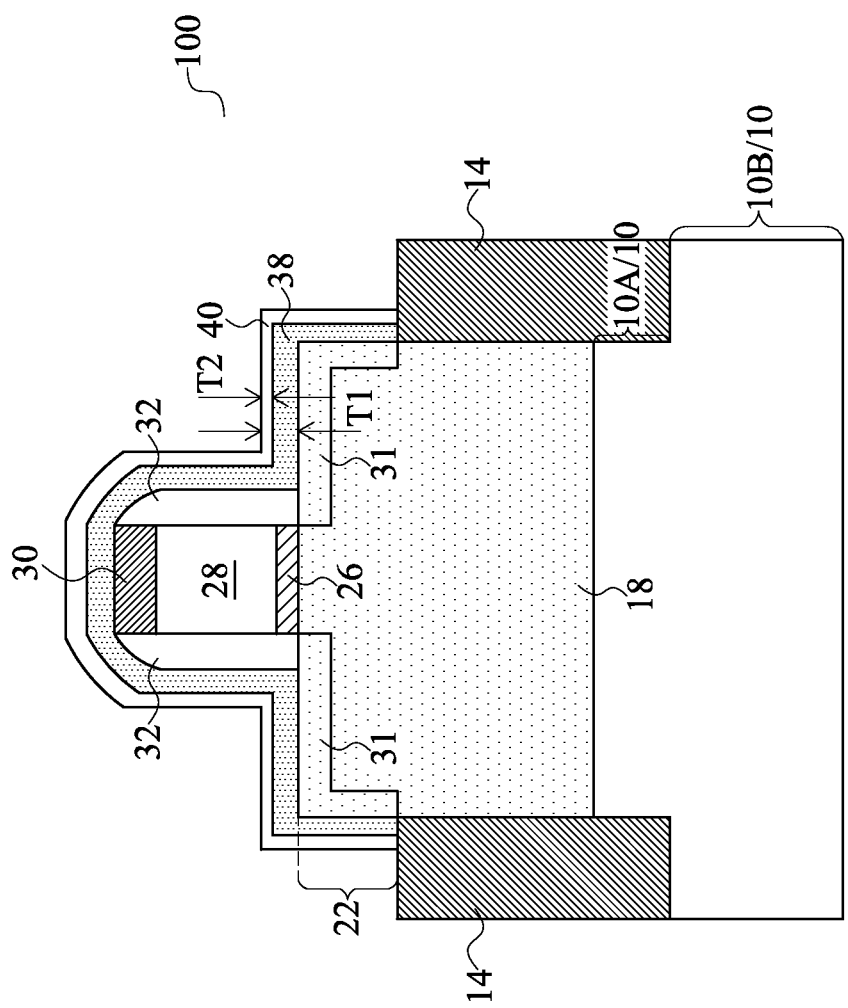

Referring to FIG. 7, impurity layer 38 is formed on the exposed surfaces of semiconductor fin 22. The formation is performed in chamber 110 in FIG. 10. In accordance with some embodiments, impurity layer 38 comprises an impurity/element that when doped into semiconductor fin 22, will make semiconductor fin 22 to be p-type or n-type. The desirable elements of impurity layer 38 depend on the material of semiconductor fin 22 and the desirable conductivity type of the resulting transistor. For example, when semiconductor fin 22 comprises a III-V compound semiconductor, impurity layer 38 may comprise sulfur, silicon, or the like. When semiconductor fin 22 comprises silicon, silicon germanium, silicon phosphorous, silicon carbon, or the like, phosphorous and arsenic may be comprised in impurity layer 38 to make the resulting transistor to be of n-type, and boron, indium, or the like may be comprised in impurity layer 38 to make the resulting transistor to be of p-type. Impurity layer 38 may have thickness T1 in the range between about 5 nm and about 40 nm, for example. It is appreciated, however, that the values recited throughout the description are merely examples, and may be changed to different values. Impurity layer 38 may be a substantially pure layer comprising substantially pure impurity elements that will make the resulting doped semiconductor fin 22 to be p-type or n-type, with the impurity elements having the percentage greater than about 90 percent, for example. Alternatively, impurity layer 38 may comprise the impurity element and some other elements, for example, the elements in the carrier gas for depositing impurity layer 38.

In accordance with some embodiments, during the deposition of impurity layer 38, a process gas containing the desirable elements of impurity layer 38 is introduced into chamber 110 (FIG. 10), in which impurity layer 38 is deposited. The deposition of impurity layer 38 may be performed using a gas-phase impurity deposition system. In some embodiments, the process gas comprises a carrier gas and an impurity-containing gas that contains the impurity for converting semiconductor fin 22 into p-type or n-type. The process gas may comprise hydrogen ($H_2$), nitrogen ($N_2$), or an inert gas such as argon and/or helium. The impurity-containing gas may comprise $(NH_4)_2S$ (which is used for introducing sulfur) or $SiH_4$ (which is used for introducing silicon). The impurity-containing gas may have a high concentration in chamber 110 (FIG. 10), for example, with a partial pressure greater than about 10 Torr. The flow rate of the impurity-containing gas may also be greater than about 10 sccm. During the introduction of the impurity-containing gas, the temperature of wafer 100 may be at a room temperature, for example, in a range between about 18° C. and 25° C., or may be at an elevated temperature, for example, between about 25° C. and about 400° C. In some embodiments, during the deposition of impurity layer 38, no plasma is generated from the respective impurity-containing gas and the carrier gas. With the presence of the high-concentration impurity-containing gas, the impurity elements in the impurity-containing gas are absorbed by wafer 100 and hence deposited.

In alternative embodiments, impurity layer 38 is formed in a plasma deposition step, wherein plasma is generated from the process gas comprising the impurity-containing gas. As a result, the impurity elements in the impurity-containing gas are deposited on wafer 100.

Next, as also shown in FIG. 7, metal layer 40 is formed on impurity layer 38, and impurity layer 38 is covered by metal layer 40. The formation of metal layer 40 may be performed in chamber 112 in FIG. 10. During the transfer of wafer 100 from chamber 110 to chamber 112 through chamber 106, vacuum may be maintained in production tool 102. In some embodiments, metal layer 40 comprises nickel, cobalt, titanium, platinum, or the like. Thickness T2 of metal layer 40 may be between about 5 Å and about 300 Å, although thickness T2 may be greater or smaller. The formation of metal layer 40 may be performed using a conformal deposition method such as Atomic Layer Deposition (ALD). Alternatively, Physical Vapor Deposition (PVD) can be used. The entirety of impurity layer 38 may be covered by metal layer 40. In some embodiments, during an entire period of time starting from the deposition of impurity layer 38 is ended to the deposition of metal layer 40 is started, no annealing at temperatures higher than about 300° C. is performed on wafer 100. Furthermore, during an entire period of time starting from the pre-clean of semiconductor fin 22 is started to the deposition of metal layer 40 is ended, no annealing at temperatures higher than about 300° C. is performed. Accordingly, as shown in FIG. 7, after the formation of metal layer 40, impurity layer 38 remains to cover semiconductor fin 22, and metal layer 40 remains to cover impurity layer 38. In some embodiments, after the formation of metal layer 40, substantially no impurity layer 38 is diffused into semiconductor fin 22.

Figure 8:
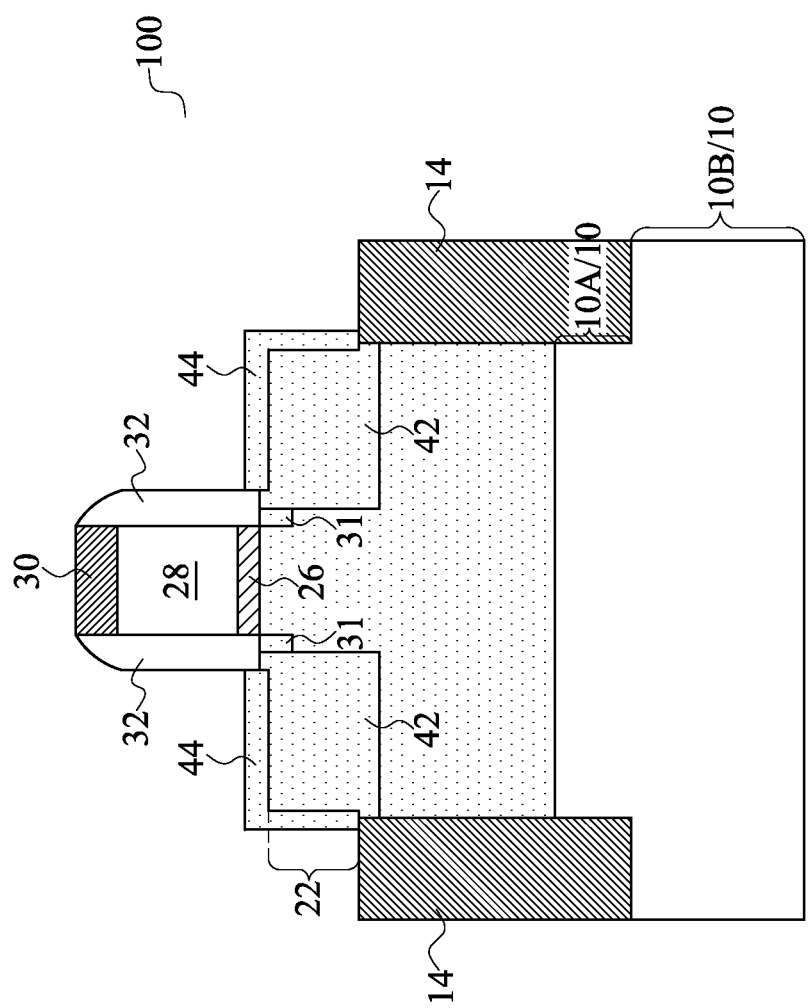

Next, an annealing step is performed on wafer 100. At the time the annealing is performed, no additional cap layer (for example, any dielectric cap layer) is formed over metal layer 40. As a result of the annealing, the impurity elements of impurity layer 38 are diffused into semiconductor fins to form source and drain regions 42. The resulting structure is shown in FIG. 8. In accordance with some embodiments, before the annealing step for form source and drain regions 42, no other heavily doped (deep) source/drain regions are formed, except LDD regions 31 may be formed.

Furthermore, as a result of the annealing, metal layer 40 reacts with semiconductor fin 22 to form source and drain silicide regions 44. In accordance with some embodiments, the annealing is performed using, for example, thermal soaking, spike annealing, flash annealing, laser annealing, or the like. The annealing time may range from about 0.1 ms to several minutes. During the annealing, the temperatures of source/drain regions 42 and silicide regions 44 may be in the range between about 300° C. and 1,200° C. After the annealing, excess portions of metal layer 40 that have not reacted with semiconductor fin 22 are removed.

Since impurity layer 38 is covered by metal layer 40 before the annealing, wafer 100 may be unloaded out of production tool 102 (FIG. 10) to perform the annealing. In alternative embodiments, the annealing is performed in production tool 102, for example, in chamber 112. As a result of the annealing, the impurities in source/drain regions 42 are also activated by the annealing. Experiment results indicated that through the embodiments of the present disclosure, the concentration of the activated impurity found using Secondary Ion Mass Electron (SIMS) may be between about $1E18/cm^3$ and about $1E19/cm^3$. The concentration found through the SIMS is at the interface region between silicide regions 44 and source/drain regions 42. The actual concentration of the impurity may be higher than what is found using SIMS.

Figure 9:
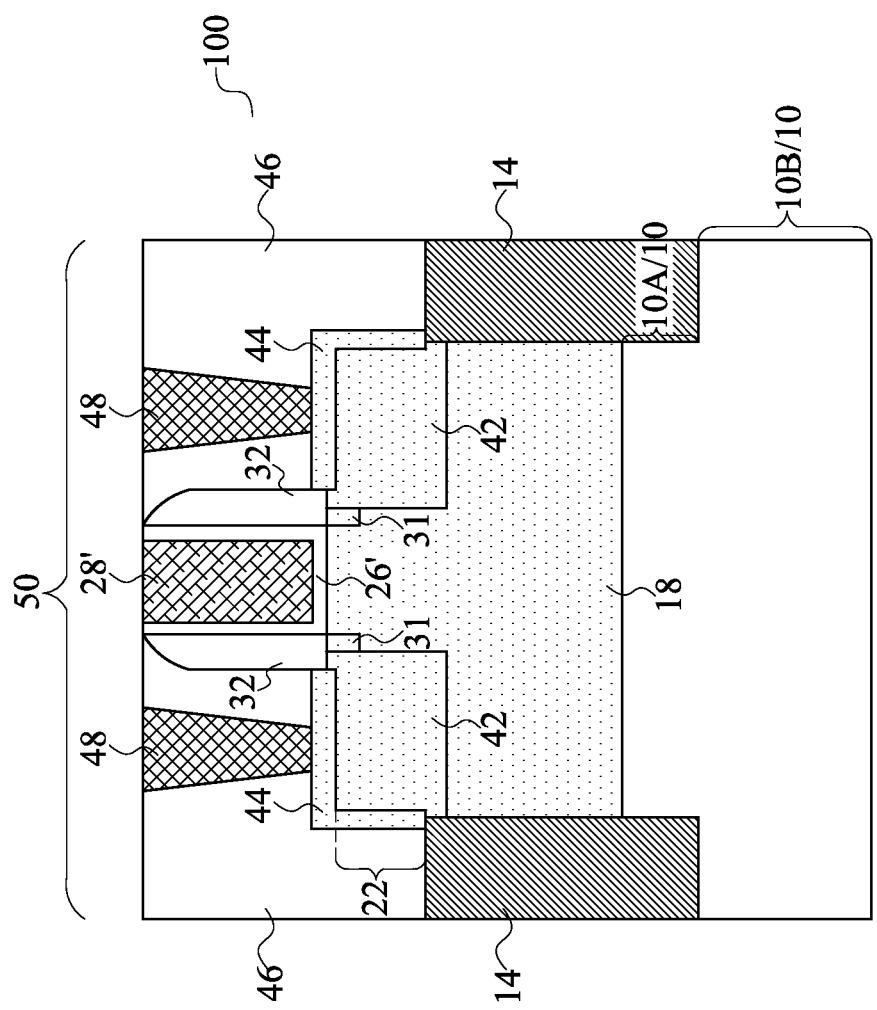

FIG. 9 illustrates the formation of Inter-Layer Dielectric (ILD) 46, and contact plugs 48 in ILD 46, wherein contact plugs 48 are electrically coupled to source/drain silicide regions 44. Hard mask 30 (FIG. 8) is also removed. In some embodiments, a replacement gate is formed to replace gate dielectric 26 and gate electrode 28 in FIG. 8. In alternative embodiments, gate dielectric 26 and gate electrode 28 (FIG. 8) are not replaced with a replacement gate. In the embodiments a replacement gate is formed, gate dielectric 26 and gate electrode 28 act as dummy gates. FIG. 9 illustrates an exemplary structure including the replacement gate. The formation process may include forming Inter-Layer Dielectric (ILD) 46, performing a CMP to level the top surfaces of ILD 46 with the top surface of gate electrode 28 or hard mask 30 (if any), and removing gate dielectric 26 and gate electrode 28 in FIG. 8. A gate dielectric layer and a gate electrode layer may then be formed to fill the opening left by the removed dummy gate, followed by a CMP to remove excess portions of the gate dielectric layer and the gate electrode layer. The remaining replacement gate includes gate dielectric 26' and gate electrode 28'. Gate dielectric 26' may comprise a high-k dielectric material with a k value greater than about 7.0, for example, and gate electrode 28' may comprise a metal or a metal alloy. ILD 46 may be formed of a dielectric material such as Phospho-Silicate Glass (PSG), Boro-Silicate Glass (BSG), Boron-Doped Phospho-Silicate Glass (BPSG), or the like. The formation of transistor 50, which is a FinFET in the illustrated embodiments, is thus finished.

Although the previously discussed embodiments use a FinFET as an example, the concept of the present disclosure is readily available for the formation of planar transistors. The process steps are similar to the illustrated embodiments, except that the recessing of STI regions 14 is skipped.

The embodiments of the present disclosure have some advantageous features. The activation of the source and drain regions is performed when a metal layer is formed. Accordingly, during the activation annealing of the source and drain regions, the metal layer acts as a cap layer to prevent the lost of the impurities that form the source and drain regions. Furthermore, the silicidation and the activation of the source/drain regions share a same annealing process, and hence the thermal budget is reduced.

In accordance with some embodiments, a method includes forming a gate stack over a semiconductor region, depositing an impurity layer over the semiconductor region, and depositing a metal layer over the impurity layer. An annealing is then performed, wherein the elements in the impurity layer are diffused into a portion of the semiconductor region by the annealing to form a source/drain region, and wherein the metal layer reacts with a surface layer of the portion of the semiconductor region to form a source/drain silicide region over the source/drain region.

In accordance with other embodiments, a method includes, in a production tool, forming an impurity layer over a semiconductor region of a semiconductor wafer, wherein the wafer includes a gate stack over the semiconductor region. The method further includes, in the production tool, depositing a metal layer over and contacting the impurity layer. During a period of time between the forming the impurity layer is started and the depositing metal layer is ended, the production tool remains to be vacuumed. An annealing is then performed, wherein elements in the impurity layer are diffused into a portion of the semiconductor region to form a source/drain region, and wherein the metal layer reacts with a surface layer of the portion of the semiconductor region to form a source/drain silicide region over the source/drain region.

In accordance with yet other embodiments, a method includes forming a gate stack over a semiconductor region, performing a pre-clean on a surface of the semiconductor region, and depositing an impurity layer over and in physical contact with the surface of the semiconductor region. The impurity layer includes an impurity that is configured to convert the semiconductor regions to p-type or n-type. A metal layer is then deposited over and contacting the impurity layer. An annealing is performed, wherein the elements in the impurity layer are diffused into a portion of the semiconductor region to form a source/drain region in the semiconductor region, and the metal layer reacts with a surface layer of the portion of the semiconductor region to form a source/drain silicide region over the source/drain region. During the annealing, no additional cap layer is formed over the metal layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a gate stack over a semiconductor region, the semiconductor region having a first conductivity type and being free of a second conductivity type;
   after the forming the gate stack, forming a lightly doped region in a top surface and sidewalls of the semiconductor region, the lightly doped region having the second conductivity type;
   after the forming the gate stack, conformally depositing an impurity layer over a top surface and sidewalls of the lightly doped region, the impurity layer having the second conductivity type, wherein the impurity layer comprises a p-type impurity or an n-type impurity;
   conformally depositing a metal layer over the impurity layer;
   forming a source/drain region by diffusing the impurity layer into the top surface of the lightly doped region, the sidewalls of the lightly doped region, and a portion of the semiconductor region free of the second conductivity type, the source/drain region having the second conductivity type after the diffusing the impurity layer, the source/drain region extending deeper into the semiconductor region than the lightly doped region; and
   forming a source/drain silicide region over the source/drain region by reacting the metal layer with a surface layer of the portion of the semiconductor region;
   wherein the source/drain region and the source/drain silicide region are formed in one annealing process step.

2. The method of claim 1, wherein before the step of annealing, no heavily doped source/drain regions are formed in the semiconductor region.

3. The method of claim 1 further comprising, before the depositing the impurity layer, performing a pre-clean on the top surface of the semiconductor region to remove a native oxide formed on the top surface of the semiconductor region.

4. The method of claim 3 further comprising, before the pre-clean:
   forming a Shallow Trench Isolation (STI) region in a semiconductor substrate;
   removing a top portion of the semiconductor substrate to form a recess, wherein the top portion is between opposite portions of the STI region; and
   performing an epitaxy to regrow a semiconductor material in the recess to form the semiconductor region.

5. The method of claim 4 further comprising:
   recessing the STI region, wherein the gate stack is formed on the top surface and sidewalls of the semiconductor region, and wherein the impurity layer and the metal layer are conformally deposited on sidewalls of the semiconductor region in the recessed STI region.

6. The method of claim 1, wherein the depositing the impurity layer comprises introducing a process gas into a chamber, with a wafer comprising the semiconductor region disposed in the chamber, and wherein during the depositing the impurity layer, no plasma is generated.

7. The method of claim 1 further comprising forming a gate spacer on the sidewalls of the gate stack, wherein the source/drain silicide region is formed under the gate stack.

8. A method comprising:
   in a production tool, conformally forming an impurity layer over a top surface and sidewalls of a semiconductor region of a semiconductor wafer, the semiconductor region extending above a top surface of an STI region adjacent the semiconductor region, wherein the semiconductor wafer comprises a gate stack over the semiconductor region, wherein a portion of the semiconductor region consists of a lightly doped region and the impurity layer is formed of substantially pure p-type or substantially pure n-type impurity;
   in the production tool, conformally depositing a metal layer over and contacting the impurity layer, wherein during a period of time between the forming the impurity layer is started and the depositing the metal layer is ended, the production tool remains to be vacuumed; and
   performing an annealing, wherein elements in the impurity layer are diffused into the top surface and the sidewalls of the semiconductor region to form a source/drain region, the source/drain region extending into the semiconductor region past the lightly doped region, and wherein the metal layer reacts with the top surface and the sidewalls of the semiconductor region to form a source/drain silicide region over the source/drain region, the source/drain silicide region extending along the sidewalls of the semiconductor region from the top surface of the semiconductor region to the top surface of the STI region, the source/drain silicide region extending along the top surface of the semiconductor region from respective sidewalls of the semiconductor region to the gate stack.

9. The method of claim 8, wherein when the annealing is performed, no additional cap layer is over the metal layer.

10. The method of claim 9 further comprising:
    forming the STI region in a semiconductor substrate;
    removing a top portion of the semiconductor substrate to form a recess, wherein the top portion is between opposite portions of the STI region; and
    performing an epitaxy to regrow a semiconductor material in the recess to form the semiconductor region.

11. The method of claim 8, wherein the annealing is performed outside of the production tool.

12. The method of claim 8, wherein the semiconductor region comprises a III-V semiconductor material, and wherein the forming the impurity layer comprises introducing a process gas selected from the group consisting essentially of $(NH_4)_2S$ and $SiH_4$ into the production tool.

13. The method of claim 8 further comprising:
forming the gate stack over the semiconductor region; and
forming gate spacers on the gate stack; and
performing a pre-clean on the semiconductor region, wherein no annealing is performed during the period of time starting from a first time point the pre-clean is started and ending at a second time point the depositing the metal layer is finished.

14. The method of claim 8, wherein the impurity layer is a substantially pure phosphorous layer or a substantially pure arsenic layer.

15. The method of claim 8 further comprising forming a gate spacer adjacent to the gate stack, wherein the source/drain silicide region is formed under the gate stack.

16. A method comprising:
recessing a shallow trench isolation (STI) region adjacent a semiconductor region;
forming a gate stack over a top surface of the STI region and the semiconductor region, the semiconductor region having a first conductivity type and being free of a second conductivity type;
performing a pre-clean on a top surface of the semiconductor region;
forming a lightly doped region in sidewalls and the top surface of the semiconductor region, the lightly doped region having the second conductivity type, the sidewalls of the semiconductor region being at ends of the semiconductor region in a longitudinal direction;
conformally depositing an impurity layer over and in physical contact with the lightly doped region on the top surface and the sidewalls of the semiconductor region, the impurity layer having the second conductivity type, wherein the impurity layer comprises an impurity that is configured to convert the semiconductor region to p-type or n-type, and the impurity layer is a conformal layer comprising a top portion overlapping the gate stack;
conformally depositing a metal layer over and contacting the impurity layer;
diffusing the impurity layer into the top surface and the sidewalls of the semiconductor region to form a source/drain region, the source/drain region extending into the semiconductor region lower than the top surface of the STI region, the source/drain region having the second conductivity type; and
reacting the metal layer with the top surface and the sidewalls of the semiconductor region to form a source/drain silicide region over the source/drain region, the source/drain silicide region extending along the sidewalls of the semiconductor region from the top surface of the semiconductor region to the top surface of the STI region, the source/drain silicide region extending along the top surface of the semiconductor region from respective sidewalls of the semiconductor region to the gate stack;
wherein the diffusing step and the reacting step occur during a single annealing step.

17. The method of claim 16, wherein before the single annealing step, no heavily doped source/drain region is formed in the semiconductor region.

18. The method of claim 16 further comprising, before the pre-clean:
forming the STI region in a semiconductor substrate;
removing a top portion of the semiconductor substrate to form a recess, wherein the top portion is between opposite sidewalls of the STI region; and
performing an epitaxy to regrow a semiconductor material in the recess to form the semiconductor region.

19. The method of claim 16, wherein the depositing the impurity layer comprises introducing a process gas into a chamber, with a wafer comprising the semiconductor region disposed in the chamber, and wherein during the depositing the impurity layer, no plasma is generated.

20. The method of claim 16, wherein the impurity layer has a first thickness from about 5 nm to about 40 nm after the conformally depositing the impurity layer, and wherein the metal layer has a second thickness from about 5 Angstroms to about 300 Angstroms after the conformally depositing the metal layer.

* * * * *